US006377095B1

United States Patent
Kuo

(10) Patent No.: US 6,377,095 B1
(45) Date of Patent: Apr. 23, 2002

(54) DIGITAL-EDGE-RATE CONTROL LVDS DRIVER

(75) Inventor: James R. Kuo, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/686,443

(22) Filed: Oct. 10, 2000

(51) Int. Cl.[7] .................................................. H03K 5/12
(52) U.S. Cl. ......................... 327/170; 327/112; 327/287
(58) Field of Search ................................. 327/109, 110, 327/111, 112, 113, 114, 130, 131, 133, 134, 135, 136, 170, 287, 288, 270–2

(56) References Cited

U.S. PATENT DOCUMENTS

| | | | | |
|---|---|---|---|---|
| 4,209,837 A | * | 6/1980 | Brown ........................ | 364/117 |
| 5,434,523 A | * | 7/1995 | Sundstrom ................... | 327/172 |
| 5,596,610 A | * | 1/1997 | Leung et al. ................ | 375/376 |
| 5,619,137 A | * | 4/1997 | Vig et al. .................... | 327/511 |
| 5,917,340 A | * | 6/1999 | Manohar et al. ............... | 326/82 |
| 5,939,926 A | * | 8/1999 | Uber ........................... | 327/382 |

* cited by examiner

Primary Examiner—Timothy P. Callahan
Assistant Examiner—An T. Luu

(74) Attorney, Agent, or Firm—Merchant & Gould P.C.; Brett A. Hertzberg

(57) ABSTRACT

A differential output driver circuit produces a differential output signal in response to an input data signal. The differential output driver circuit provides for a controlled edge rate in the differential output signal when the input data signal changes logic states. Control signals are generated using an adjustable delay circuit, each subsequent control signal being delayed in time from the preceding control signal by a unit delay time. The control signals control N output drivers, each of the N output drivers having an output signal coupled to the differential output signal, and each contributing a portion of the differential output signal. When the input data signal changes from one logic state to another, the differential output signal will have a defined edge rate determined by the unit delay time and the contributing portion from each of the N output drivers. In one example, the unit delay time is determined by a delay time through a buffer that has a controlled current limit. The current limit is provided by a current source that is compensated for semiconductor processing variations and temperature variations. Semiconductor processing variations are corrected by producing a current inversely proportional to a MOS transistor's trans-conductance. Since the current limit in the buffer is raised for slower transistors (lower trans-conductance), the unit delay time is compensated when the process parameters vary. The differential output driver circuit provides for minimum over-shoot, low jitter, low distortion, low signal skew, and a controlled rise and fall times over varied common mode voltages.

28 Claims, 13 Drawing Sheets

DELAY CELL (DLY)

*TRANSIENT RESPONSE - DIFFERENTIAL OUTPUTS AT 3 DIFFERENT COMMON MODES*

*TRANSIENT RESPONSE - 3 DIFFERENT COMMON MODE DIFFERENTIAL OUTPUTS SUPERIMPOSED.*

DIGITAL-EDGE-RATE CONTROL LVDS DRIVER

FIELD OF THE INVENTION

The present invention relates to a method and apparatus for controlling the rise time and fall time of a differential output digital signal. More specifically, the present invention provides for a method and apparatus to reshape a data input based upon a clock signal, provide n parallel connected output drivers, provide n sets of control signals to control the edge-rate of the n output drivers, and the output drivers provide minimum over-shoot, low jitter, low signal skew, and a well controlled rise and fall time over varied common mode voltages.

BACKGROUND OF THE INVENTION

Low Voltage Differential Signaling (hereinafter referred to as LVDS) is a technology used in data transmission systems. A low voltage differential signal produced by a line driver typically has peak-to-peak amplitudes in the range from 250 mV to 450 mV. The low voltage swing minimizes power dissipation, while maintaining high transmission speeds. Typical transmission speeds are over 100 Mbps (Mega-bits per second).

In some applications it is necessary for a line driver to produce a differential output that has a rise and fall time within specified limits. Very fast rise and fall times tend to cause a power supply line bounce condition, where the sudden increase in current driven into the power supply line causes a glitch to appear on the power supply line. Also, very fast rise and fall times may result in a glitch in the differential output signal. Glitches that appear in the power supply lines and the differential output signals can be limited by increasing the rise and fall times accordingly.

One technique used to increase the transition time (rise and fall) for a differential line driver was to increase its gate input transition time, which resulted in reducing the driver's effective data rate and increasing noise jitter due to the slower transition time. Also, the output waveforms tend to distort when the common mode voltage increases (i.e. the common mode voltage is increased from 0.8V to 2.5V) due to the non-linearity of the small-signal trans-conductance from the gate to the channel ($g_m$) of the output transistors of the differential line driver. Additionally, over the common mode voltage range, the output signal of the differential line driver can have undesirable over-shoot and under-shoot causing distortion in the output signal (common mode induced jitter).

SUMMARY OF THE INVENTION

In accordance with the invention, the above and other problems are solved by an apparatus and method for generating a differential output signal. Briefly stated, the present invention relates to differential output driver circuits that produce a differential output signal in response to an input data signal. The differential output driver circuit provides for a controlled edge rate in the differential output signal when the input data signal changes logic states. Control signals are generated using an adjustable delay circuit, each subsequent control signal being delayed in time from the preceding control signal by a unit delay time. The control signals control N output drivers, each of the N output drivers having an output signal coupled to the differential output signal. Each of the N output drivers contributes a portion of the differential output signal. When the input data signal changes from one logic state to another, the differential output signal will have a defined edge rate determined by the unit delay time, N, and the contributing portion from each of the N output drivers. In one example, the unit delay time is determined by a delay time through a buffer that has a controlled current limit. The controlled current limit is provided by a current source that is compensated for semiconductor processing variations and temperature variations. Variations in semiconductor processing are corrected by producing a current that is inversely proportional to the trans-conductance of a MOS transistor reference device. Since the current limit in the buffer is raised for slower transistors (lower trans-conductance), the unit delay time is maintained within tolerable limits when the process parameters vary. The differential output driver circuit is compensated to provide minimum over-shoot, low jitter, low distortion, low signal skew, and a controlled rise and fall times over varied common mode voltages.

In accordance with an aspect of the invention, a differential output signal is produced in response to an input data signal. A control logic circuit produces control signals corresponding to the input data, and a driver circuit produces the differential output signal in response to the control signals. The driver circuit has N driver cells, each of the N driver cells generating a respective output signal in response to a respective control signal. The respective output signals of the N driver cells are arranged such that each of the N driver cells provides a portion of the differential output signal.

In accordance with a further aspect of the invention, a change in the input data signal results in a change in the control signals for one of the N driver cells at a time different from the other of the N driver cells such that the rise time of the differential output signal is proportional to the time difference.

In accordance with yet a further aspect of the invention, a change in the input data signal results in a change in the control signals for one of the N driver cells at a time different from the other of the N driver cells such that the fall time of the differential output signal is proportional to the time difference.

In accordance with another feature of the invention, a control logic circuit has N delay circuits, each of the N delay circuits including: a delay cell having an input and output, the delay cell is current limited by a current limit amount, a delay time corresponds to the delay between an input change and an output change, and the delay time is proportional to the current limit amount.

In accordance with yet another feature of the invention, the control logic circuit includes a delay circuit with an input and output, a delay time from the input to the output is controlled by a current reference, and the current reference is compensated to reduce variations in the delay time. In one embodiment of the invention, the current reference includes a MOS transistor that has a trans-conductance parameter, the MOS transistor is arranged to conduct a current that is proportional to the trans-conductance parameter, a difference circuit provides another current that corresponds to a difference between a temperature compensated current and the current, and a reference MOS transistor is arranged to conduct a bias current that corresponds to a sum of the another temperature compensated current and the another current such that the bias current is inversely proportional to the trans-conductance and variations in the delay time due to changes in trans-conductance are reduced. In another embodiment of the invention, the current reference includes a resistor having a resistor value and a temperature coefficient, a temperature compensated current is coupled to the resistor to produce a gate voltage that is independent of temperature, a MOS transistor is arranged to conduct a current that is proportional to the gate voltage, a difference circuit provides another current that corresponds to a difference between another temperature compensated current and the current, and a reference MOS transistor is arranged to conduct a bias current that corresponds to a sum of the another temperature compensated current and the another current, such that the bias current is independent of temperature and variations in the delay time due to changes in temperature are reduced.

According to a feature of the invention, a differential output signal is produced in response to an input data signal. The driver circuit has N driver cells, each of the N driver cells generating a respective output signal in response to a respective control signal. A current source provides a controlled current. The controlled current is coupled to the driver circuit such that each respective outputs signal corresponds to a portion of the controlled current. The sum of the portions from each respective output signal corresponds to the controlled current. In one embodiment of the invention, a current source provides power to the driver cells, the driver cells consume current when enabled; and the driver cells do not consume current when disabled. A standby circuit loads the current source when active, and does not load the current source when inactive. The standby circuit is activated prior to enabling the driver cells that are disabled, and is deactivated after the driver cells are enabled. The standby circuit provides a load to the current source that is comparable to the load on the current source when the driver cells are enabled, such that enabling the driver cells does not cause a glitch in the differential output signal.

According to another feature of the invention, a driver cell is provided for that includes: a first, second, third and fourth switching element, each switching element conducts when activated by a respective control signal. The first and second switching elements are coupled to a first power connection. The third and fourth switching elements are coupled to a second power connection. The second and third switching elements are arranged such that when activated the differential output signal is a polarity. The first and fourth switching elements are arranged such that when activated the differential output signal is another polarity.

According to yet another feature of the invention, a driver cell is provided for where each driver cell further includes an anti-glitch circuit. Each anti-glitch circuit minimizes glitches from appearing in the differential output signal. Each anti-glitch circuit may include a first, second, third and fourth capacitor coupled to each respective switching element.

According to another aspect of the invention, an apparatus generates a differential output signal from an input data signal. The apparatus includes a control logic circuit and a driver circuit. The control logic circuit produces control signals related to the input data signal. The driver circuit produces the differential output signal in response to the control signals. The driver circuit includes a plurality of driver cells, each generating an output signal in response to associated control signals, the driver output signals being arranged so that each of the plurality of driver cells provides a portion of the differential output signal. In one embodiment, a group of the plurality of driver cells are commonly controlled by control signals. In another embodiment, control signals are associated with a separate group of the plurality of driver cells, wherein the control signals commonly control the associated separate group of the plurality of driver cells such that the portion of the differential output signal provided by the separate group of the plurality of driver cells is different from the portion provided by another of the plurality of driver cells. Alternatively, the portion of the differential output signal provided by one of the plurality of driver cells may be different from the portion of the differential output signal provided by another of the plurality of driver cells. Thus, each output driver cell may provide a different level of output signal.

According to an aspect of the invention, an apparatus for generating a differential output signal from an input data signal includes means for producing a time delay, means for producing a differential output signal corresponding to the input data signal, and means for controlling an edge rate of the differential output signal such that an edge rate in the differential output signal is proportional to the time delay.

According to a further aspect of the invention, the means for controlling the edge rate includes means for producing a first control signal from the input data signal, and means for producing a second control signal. The second control signal is the same as the first control signal skewed in time by the time delay. A means for producing the differential output signal in response to the first and second control signals such that the time delay corresponds to an edge rate in the differential output signal. Also, the means for producing a time delay may include means for generating a current level, the current level being inversely proportional to the time delay.

According to yet a further feature of the invention, the means for generating a differential output signal includes means for generating N equal outputs staggered over equal time intervals. Each of the N outputs corresponding to an equal portion of the differential output signal. The resulting differential output signal has an edge rate that corresponds to the N equal time intervals. Also, a means for maintaining a constant edge rate is provided such that the differential output signal has a constant edge rate for varying output common mode voltages.

According to an aspect of the invention, a method of generating a differential output signal from an input data signal provide for generating a control signal in response to a change in the input data at an initial time, generating another control signal in response a change in the control signal at a subsequent time, producing an output signal in response to the control signal, producing another output signal in response to the another control signal, and summing together the output signal and the another output signal to produce the differential output signal, the edge rate in the differential output corresponding to the difference between the initial time and the subsequent time. Also, a time delay is generated based upon at least one semiconductor processing parameter, the difference between the initial time and the subsequent time is proportional to the time delay.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

As will become apparent from the discussion and figures that are described below, the present invention provides for an analog front end LVDS line driver. The LVDS line driver is a scalable design that permits scaling of the output drive level by connecting n driver cells in parallel to one another. A temperature compensated current source is used to bias n programmable delay cells. The delay cells provide for edge-rate control of the output signal.

Figure 1:
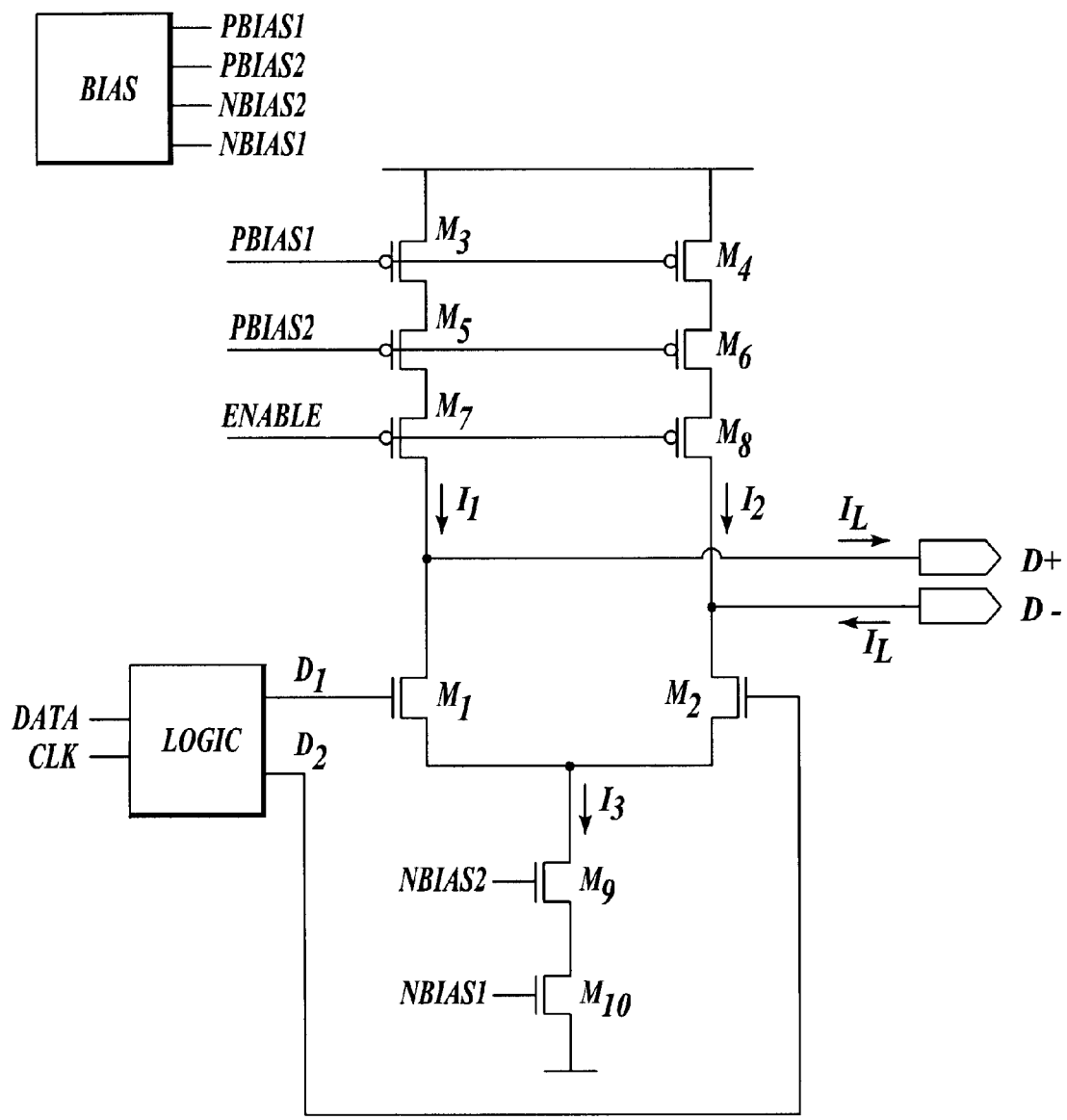
FIG. 1 shows a schematic diagram of a differential line driver.

A differential line driver is shown in FIG. 1. Transistors $M_1$ and $M_2$ are controlled by complementary data inputs $D_1$ and $D_2$. Transistors $M_3$ and $M_5$ form a current source providing current $I_1$ when switching transistor $M_7$ is activated (ENABLE =Logic 0). Similarly, transistors $M_4$ and $M_6$ form a current source providing current $I_2$ when switching transistor $M_8$ is activated (ENABLE=Logic 0). Transistors $M_9$ and $M_{10}$ form a "tail" current source for the differential driver, providing a current of $I_3$. An output signal is differentially provided across a load at terminals D+ and D−. When load current $I_L=0$, $I_3=I_1+I_2$. When $M_1$ is off and $M_2$ is on, the load current is given by $I_L=I_1=I_3-I_2$. Alternatively, when $M_1$ is on and $M_2$ is off, the load current ($I_L$) will change polarity but maintain the same value.

Figure 2:
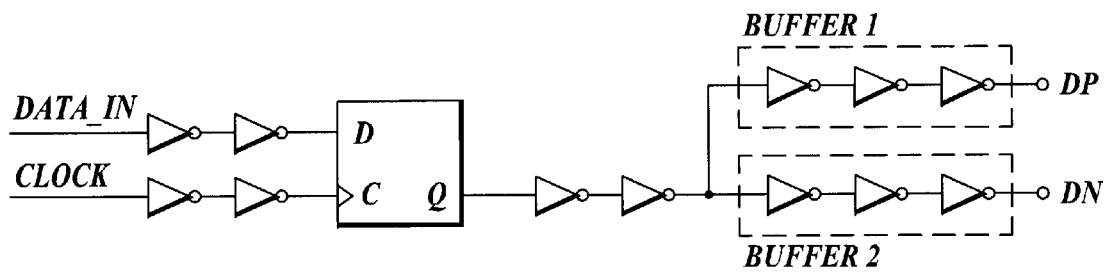
FIG. 2 illustrates a schematic diagram of a data shaper logic circuit.

Control inputs D1 and D2 are provided by a logic circuit as shown in FIG. 2. The data is first synchronized with the clock signal using inverters and a D-type latch. The output of the latch is through two buffers to generate the complementary signals DP and DN (DP is the opposing logic level to DN).

The line driver shown in FIG. 1 has several operational problems. First, the rise and fall times of the output signal depend upon the $f_T$ (unity gain bandwidth) of transistors $M_6$ and $M_8$, which is an uncontrolled amount. Also, the rise and fall times cannot be slowed down by the miller capacitance between the drain and gate of each output transistor due to the low $g_m$ (small-signal trans-conductance from the gate to the channel). Additionally, the circuit shown in FIG. 1 tends to have severe distortion when the output driver common mode varies.

Figure 3:
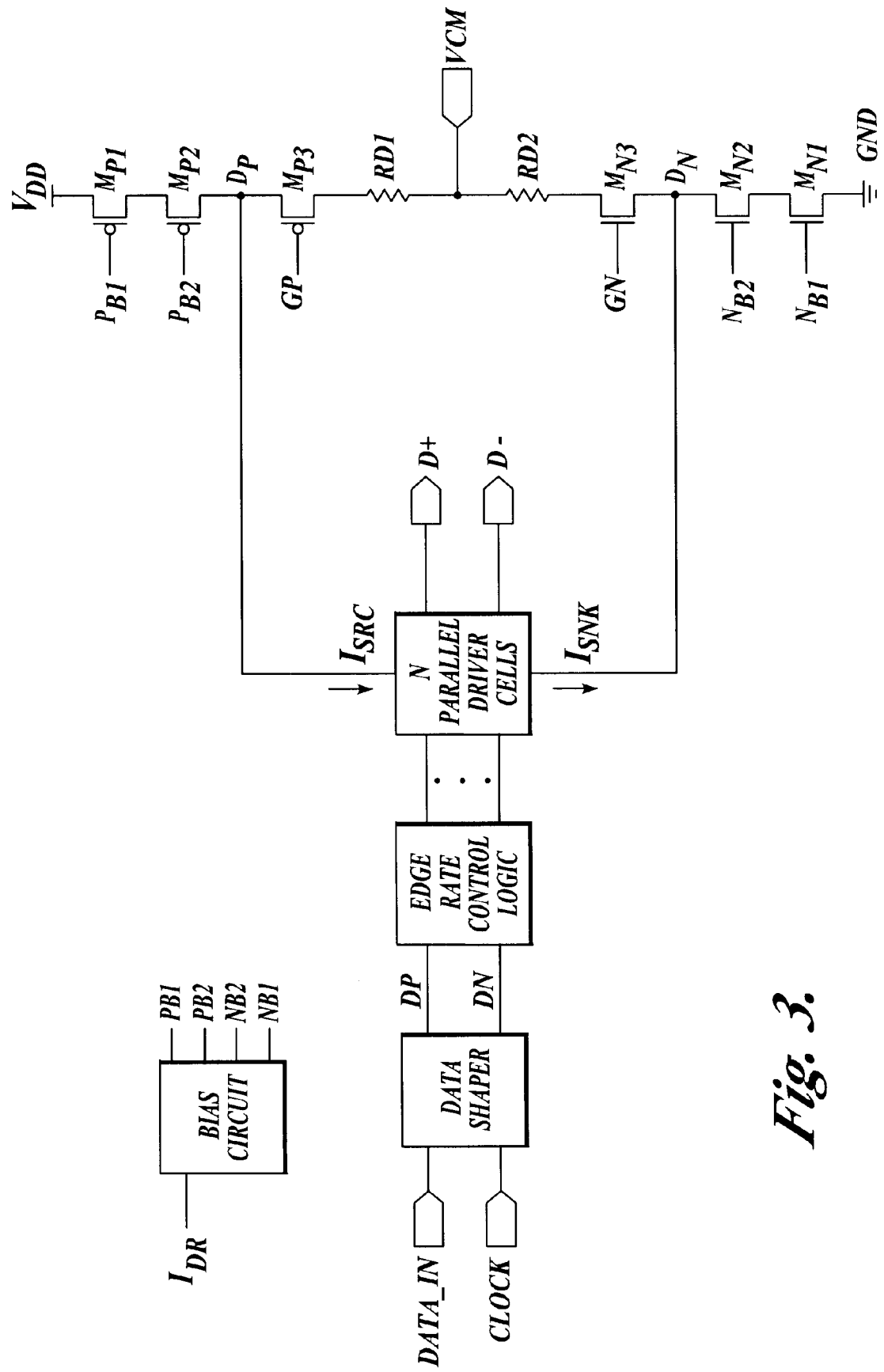
FIG. 3 shows a schematic diagram of an electronic system according to the present invention.

FIG. 3 shows an electronic system according to the present invention. A data signal and a clock signal are shaped by a data shaper to provide two signals corresponding to the top and bottom output drivers (DP, DN). DP and DN are coupled to the edge-rate control logic circuit, which produces control signals for each output driver. A differential signal is produced across D+ and D− by the n parallel-connected driver cells. Current sources $M_{P1}$, $M_{P2}$ and $M_{N1}$, $M_{N2}$ drive current into dummy load resistors ($R_{D1}$, $R_{D2}$) through transistors $M_{P3}$ and $M_{N3}$ respectively.

Prior to beginning data transmission, the n output driver cells are disabled (or tri-stated). In this "pre-active mode", currents $I_{SRC}$ and $I_{SNK}$ are zero, node $D_P$ rises up to VDD, and node $D_N$ drops down to GND. Just prior to activating the drivers, transistors $M_{P3}$ and $M_{N3}$ are activated (control logic not shown) to pull nodes DP down and DN up to their respective normal operating voltage levels. After the output drivers are activated, the dummy load is disconnected from the current sources by deactivating transistors $M_{P3}$ and $M_3$.

Although $M_{P3}$ is shown as a single transistor, $M_{P3}$ may be an array of n PMOS transistors connected in parallel to one another. Each transistor should have a size proportional to the size of transistor $M_A$ shown in FIG. 5. This will ensure that node $D_P$ will be set to the normal operating voltage of the current sources when the output is enabled. The gate of each PMOS transistor in the array may be coupled to independent inputs, such that the transistors do not turn on simultaneously, causing a glitch in the system. $M_{N3}$ may similarly be an array of n NMOS transistor connected in parallel to one another, and sized the same as transistor $M_B$ shown in FIG. 5.

Figure 4:
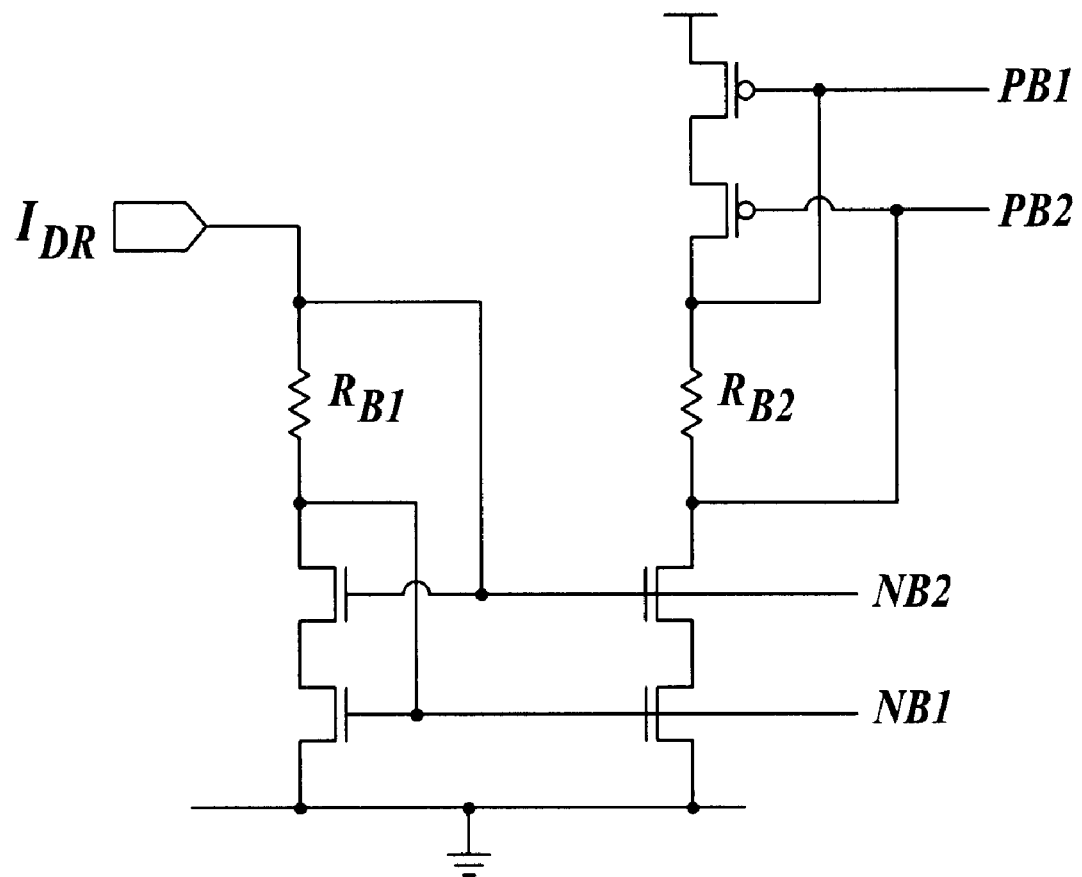
FIG. 4 illustrates a schematic diagram of a bias circuit.

The cascode biasing current for transistors $M_{P1}$, $M_{P2}$, $M_{N1}$, and $M_{N2}$ are determined from a biasing circuit shown in FIG. 4. Resistors $R_{B1}$ and $R_{B2}$ are of equal value. The resistance values of $R_{B1}$ and $R_{B2}$ are used to bias $M_{P1}$ and $M_{N1}$ so that the current source output impedance can be enhanced. Thus, the resistance values of resistors $R_{D1}$ and $R_{D2}$ are selected to be close to the equivalent load resistance. An external device such as a resistor and/or a source (voltage source or current source) is coupled to the current input node $I_{DR}$. By setting the current level flowing through input IDR, the maximum current level flowing through the driver cells is also set.

Figure 5:
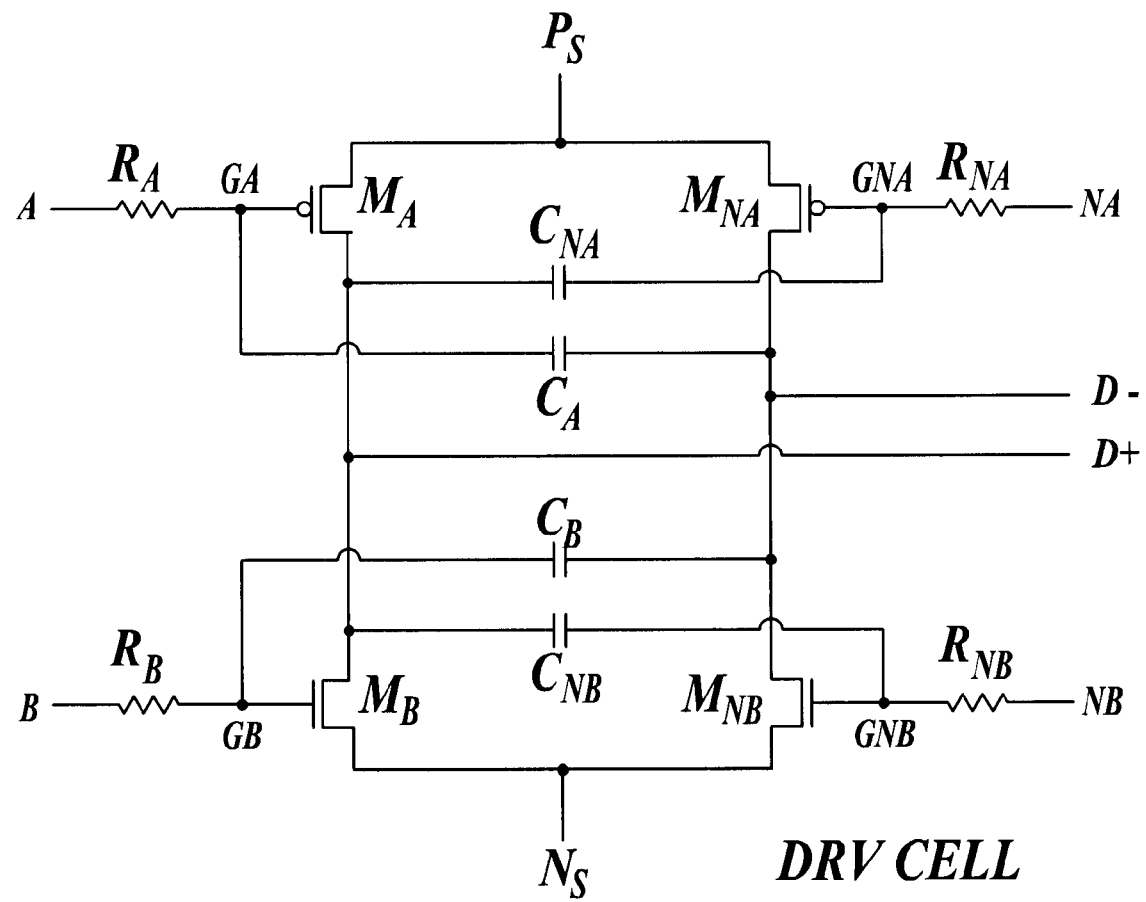
FIG. 5 shows a schematic diagram of a driver cell.

FIG. 5 shows a driver cell in accordance with the present invention. The driver cell (DRV) is made up of a pair of n-channel transistors ($M_B$, $M_{NB}$), a pair of p-channel transistors ($M_A$, $M_{NA}$), four capacitors ($C_A$, $C_{NA}$, $C_B$, $C_{NB}$), and four resistors ($R_A$, $R_{NA}$, $R_B$, $R_{NB}$). The p-channel transistors share a common source connection at input node PS. The n-channel transistors share a common source connection at input node NS. Transistors $M_A$ and $M_B$ share a common drain connection at input node D+, while transistors $M_{NA}$ and $M_{NB}$ share a common drain connection at input node D−. The gates of transistors $M_A$, $M_{NA}$, $M_B$, and $M_{NB}$ are series connected to their respective inputs (A, NA, B, NB) through their respective resistors ($R_A$, $R_{NA}$, $R_B$, $R_{NB}$). The input signals (A, NA, B, and NB) are driven by complementary signal pairs from the edge-rate control logic circuit.

The capacitors ($C_A$, $C_{NA}$, $C_B$, $C_{NB}$) are configured to serve as miller compensation capacitors. For Example, transistor $M_A$ has a parasitic gate to drain capacitance ($C_{GDA}$) resulting in a miller current $I_{MA}$ which is cancelled by a second current ($I_{CA}$) through capacitor $C_A$. Similarly, capacitors $C_{NA}$, $C_B$, and $C_{NB}$ compensate for the miller capacitance of transistors $M_{NA}$, $M_B$ and $M_{NB}$. Transistors having the drain and source connected together may serve as a capacitor, the gate connection being one plate and the source/drain connection as the other plate.

The resistors ($R_A$, $R_B$, $R_{NA}$, $R_{NB}$) are used to provide a low pass filtering effect on the input control signals (A, B, NA, NB). These resistors work in conjunction with the capacitors ($C_A$, $C_{NA}$, $C_B$, $C_{NA}$) and other parasitic capacitances in the circuit to roll off the high frequency components of the input control signals. By slowing down the edges on the input control signals, transistors $M_A$, $M_B$, $M_{NA}$, $M_{NB}$ are turned on slower, and fewer glitches appear in the output signal (D+, D−) and the power supply lines.

The present invention uses two pairs of switching transistors (two p-channel and two n-channel) to drive the output. During operation, current flows into the driver through input node PS and out of the driver through output node NS. By using two pairs of transistors as described above, a single current source may drive the output driver cell, conserving power, chip layout area and easing layout design.

Figure 6:
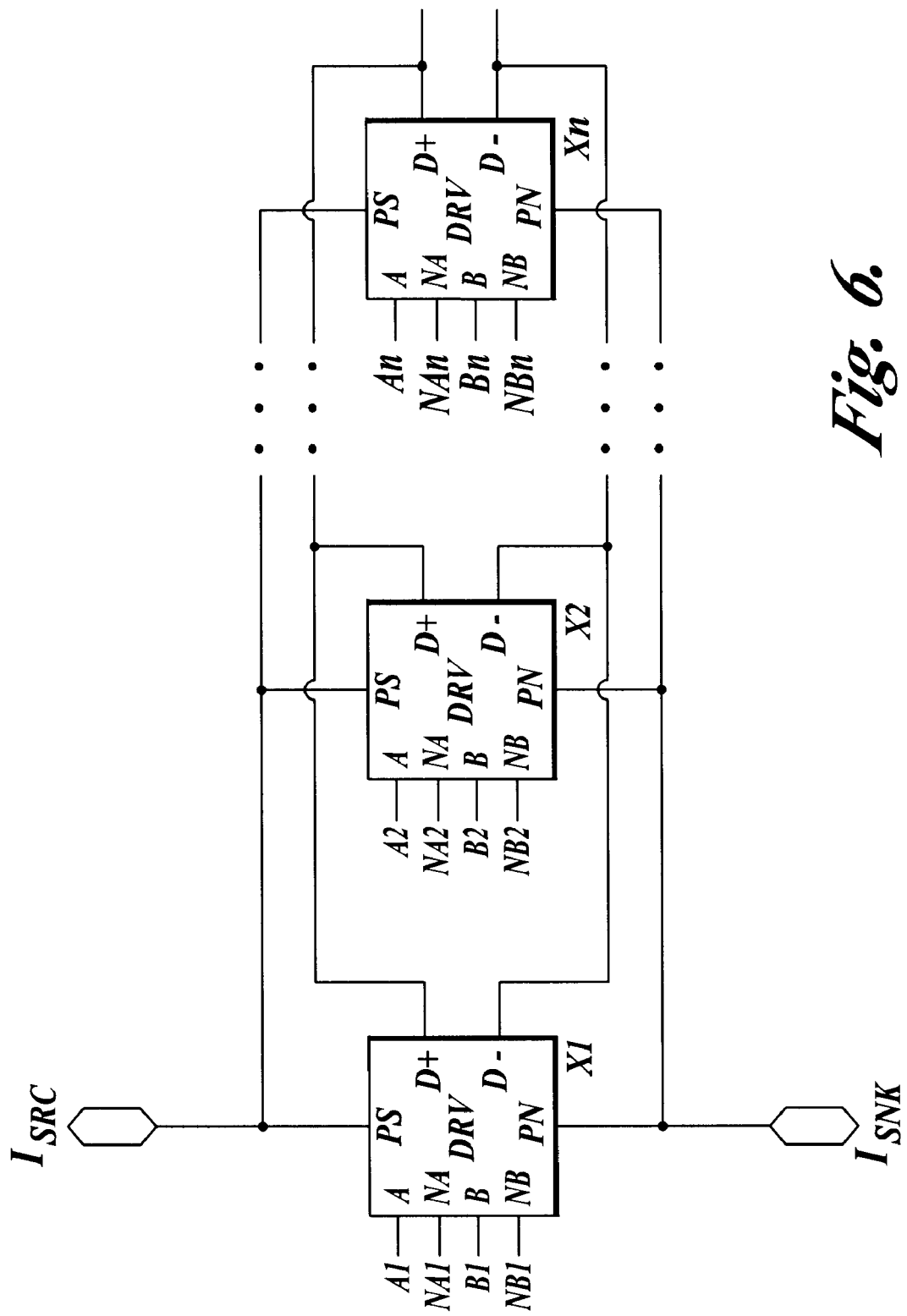
FIG. 6 illustrates a schematic diagram of an output driver circuit.

FIG. 6 shows an output driver circuit designed using the output driver cell illustrated in FIG. 5. As shown in FIG. 6, an array of n driver cells (DRV) are connected together with paralleled output connections D+ and D−. The PS connections of the driver cells are connected in common to a source current connection $I_{SRC}$. The NS connections of the driver cells are connected in common to a sink current connection $I_{SNK}$. Each driver cell has a separate set of control connections (A, NA and B, NB) corresponding to separate control lines from the edge-rate control logic circuit.

Figure 7:
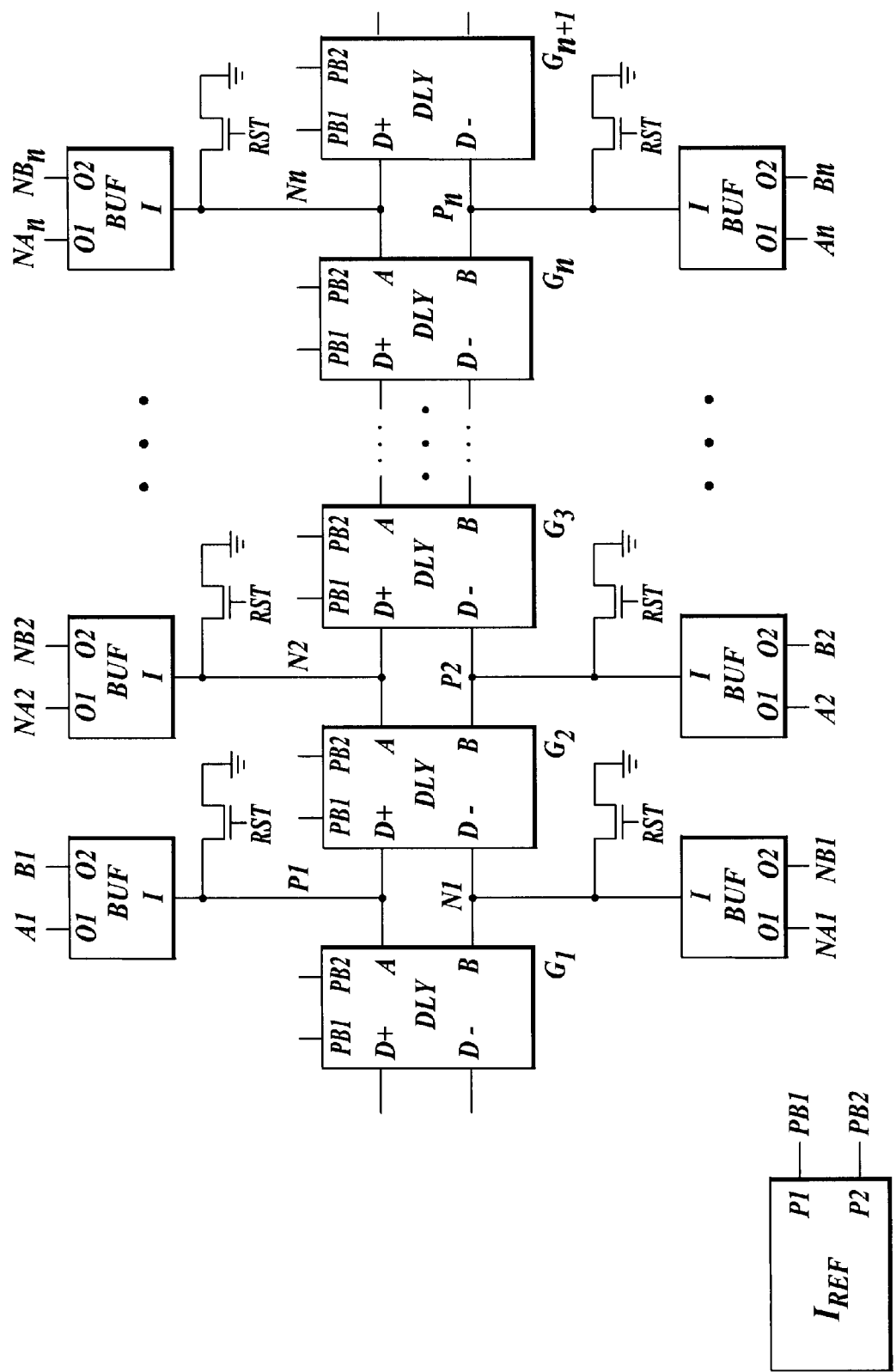
FIG. 7 shows a schematic diagram of an edge-rate control logic circuit.

FIG. 7 shows the edge-rate control logic that is used to drive the output driver illustrated in FIG. 6. An array of n+1 delay cells $G_1$–$G_{n+1}$ generate signals $N_1$–$N_n$ and $P_1$–$P_n$. Each delay cell has data inputs D+ and D−, outputs A and B, and bias connections PB1 and PB2. Bias connections PB1 and PB2 are provided by a temperature compensated current reference IREF. Each delay cell (DLY) is coupled to a pair of output buffers (BUF), generating a pair of complementary output signals (A, NA and B, NB). The delay cells should have matched delay times. Delay gate $G_{n+1}$ is a dummy load delay cell, loading down delay cell $G_n$ such that the delay time through delay cell n matches the delay times through the other cells. NMOS transistors initialize the delay cells by coupling the output of each delay cell to ground when a reset (RST) condition is present (i.e. during power up).

Figure 8:
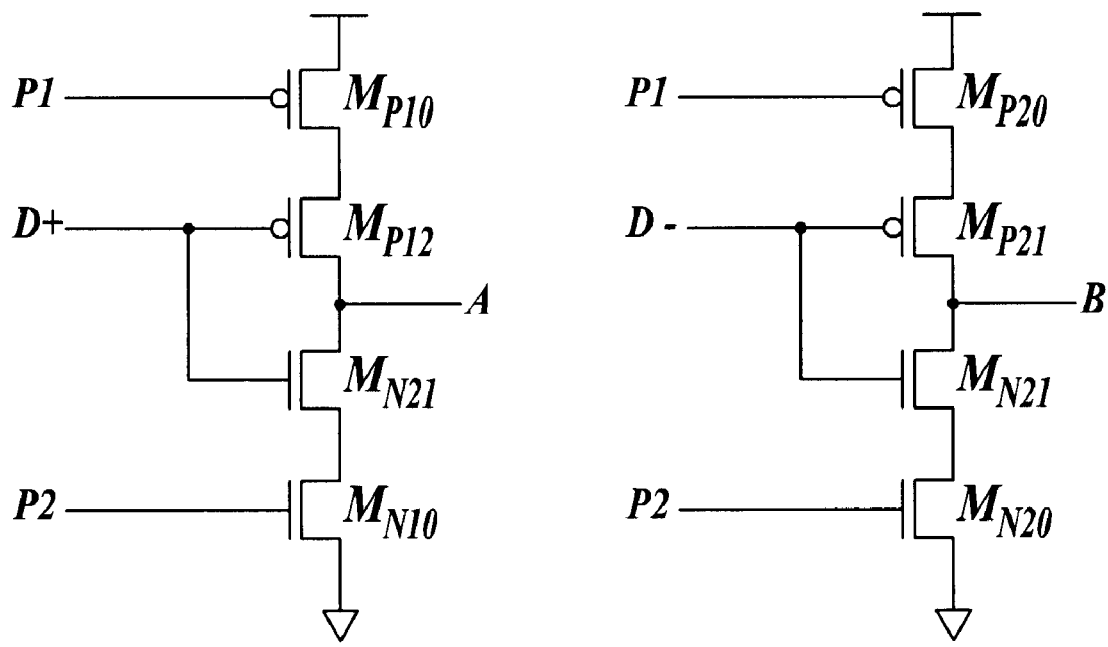
FIG. 8 illustrates a schematic diagram of a delay cell.

A delay cell is shown in FIG. 8. Transistor $M_{P10}$ has a source connected to the positive supply, a gate connected to bias connection P1, and a drain connected to the source of transistor $M_{P11}$. Transistor $M_{N10}$ has a source connected to the negative supply, a gate connected to bias connection P2, and a drain connected to the source of transistor $M_{N11}$. Transistors $M_{P11}$ and $M_{N11}$ share gate connection to input node D+, and common source connections to output node A. Thus, transistors $M_{P11}$ and $M_{N11}$ form an inverter cell with currents limited to the currents derived in the temperature compensated current reference discussed below. Transistors $M_{P21}$ and $M_{N21}$ share gate connection to input node D−, and common source connections to output node B. Similar to transistors $M_{P10}$ and $M_{N10}$, transistors $M_{P20}$ and $M_{N20}$ form current sources that are connected in series to the inverter formed by transistors $M_{P21}$ and $M_{N21}$.

Each delay element consists of a CMOS inverter (e.g. $M_{P11}$, $M_{N11}$) with power supply connections provided by a sourcing current source (e.g. $M_{P10}$) and a sinking current source (e.g. $M_{N10}$). The current flowing through the inverter is limited by the current sources such that a change in the input (e.g. D+) results in a change in the output (e.g. A) that is delayed by an amount controlled by the current levels. A temperature compensated current reference controls the current levels.

Figure 9:
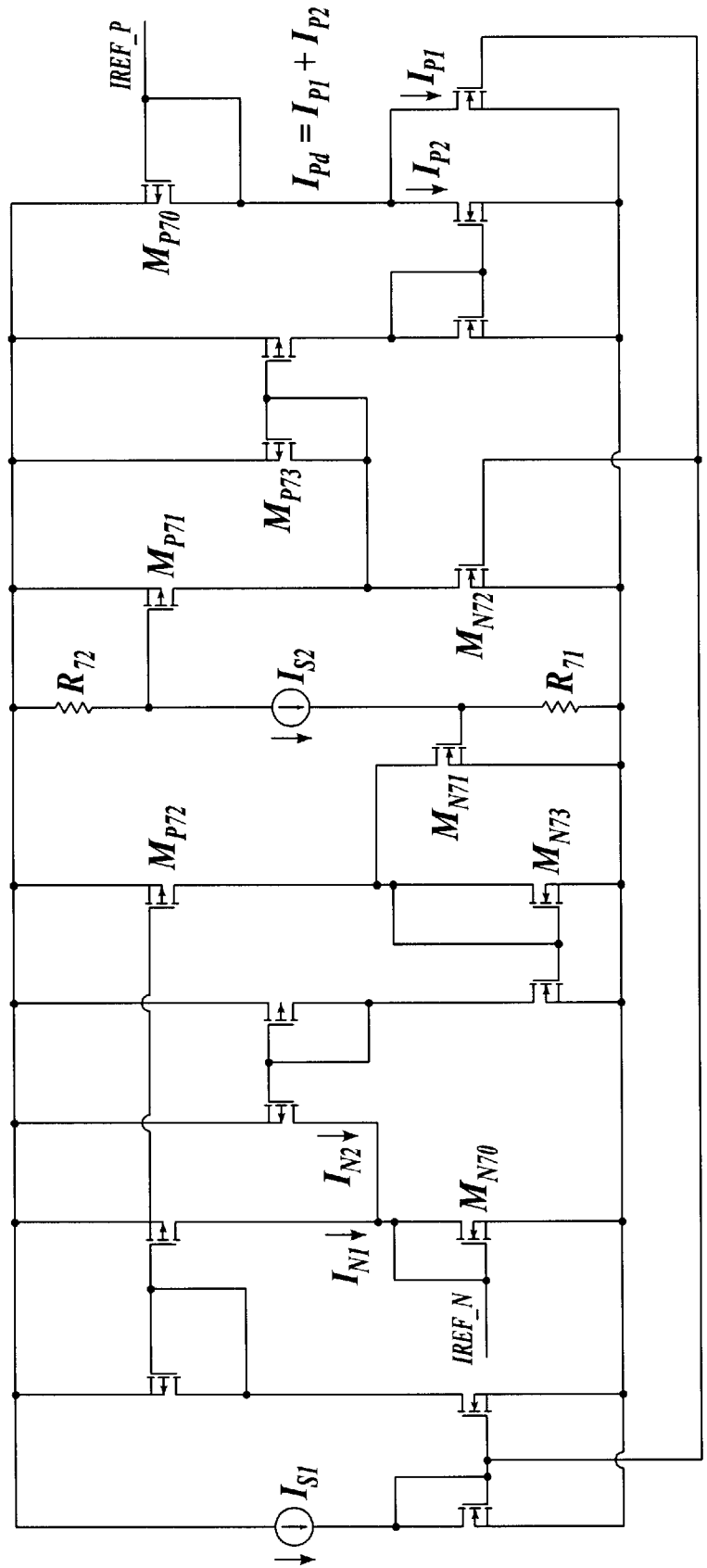
FIG. 9 shows a schematic diagram of a temperature compensated current reference.

A temperature compensated current reference is shown in FIG. 9. The current sources ($I_{S1}$, $I_{S2}$) are generated using a bandgap reference voltage source. Bandgap reference circuits use the inherent characteristics of bipolar transistors and the temperature coefficients of resistors to compensate for temperature effects and provide a voltage reference ($V_{BG}$) that is relatively independent of temperature. The current sources ($I_{S1}$, $I_{S2}$) are generated by applying the bandgap voltage (not shown) across a resistor ($R_{SET}$, not shown). The currents are proportional to $V_{BG}/R_{SET}$. The temperature coefficient of $V_{BG}/R_{SET}$ is roughly determined by resistor $R_{SET}$. The current drive creates a voltage drop across resistors $R_{71}$ and $R_{72}$. The voltage drops across the resistors ($R_{71}$, $R_{72}$) are used to bias transistors $M_{N71}$ and $M_{P71}$ respectively. The currents from transistors $M_{P72}$ and $M_{N72}$ are derived from the same current source reference ($I_{S1}$). Since the current is driven through the resistors, the gate voltages of transistors $M_{N71}$ and $M_{P71}$ only depend on the temperature coefficient of the bandgap reference.

The trans-conductance ($g_m$) of a transistor will be high when the semiconductor process is fast, and low when the semiconductor process is slow. Since the gate voltages driving transistors $M_{N71}$ and $M_{P71}$ are relatively constant, the currents flowing through transistors $M_{N71}$ and $M_{P71}$ will decrease when the process varies from a typical process to a slow process. Current source $I_{S1}$ determines the current flowing through transistors $M_{P72}$ and $M_{N72}$. Thus, a decrease in $g_m$, which causes the current through $M_{N71}$ and $M_{P71}$ to decrease, results in an increase in current through $M_{N73}$ and $M_{P73}$ respectively. The increase in currents through $M_{N73}$ and $M_{P73}$ will cause the reference currents through transistors $M_{N70}$ and $M_{P70}$ to also increase accordingly. The temperature/process compensated current source discussed above results in a relatively constant delay through the delay cells (DLY) with reference to FIGS. 7 and 8.

Figure 10:
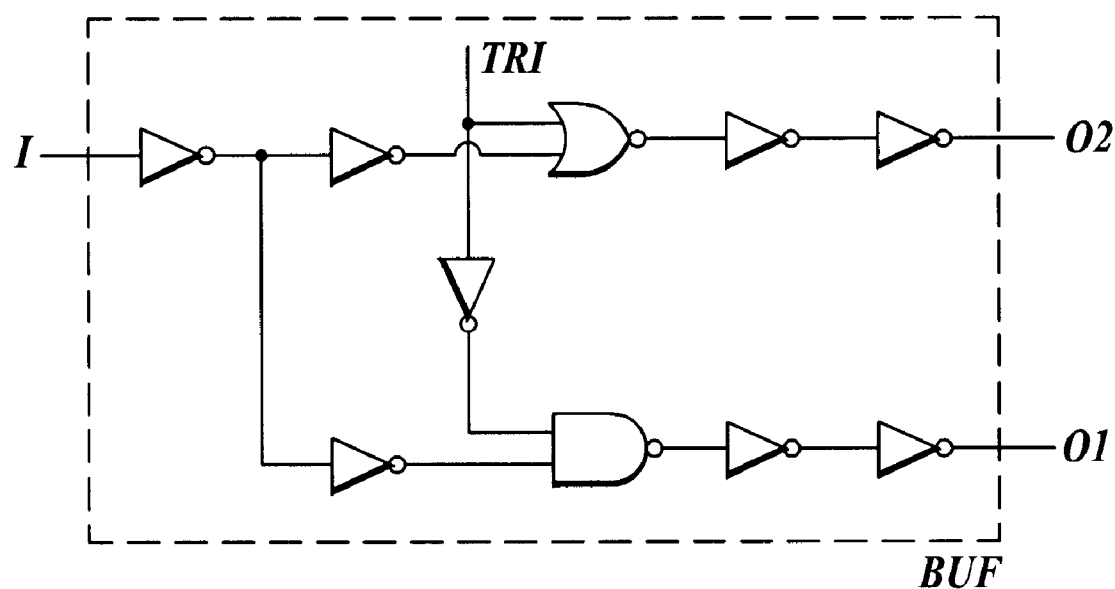
FIG. 10 illustrates a schematic diagram of a buffer cell.

The output of each delay circuit is driven into a buffer cell as shown in FIG. 7. A detail of a buffer cell is shown in FIG. 10. Two control outputs (O1, O2) are generated in response to the input (I) and a tri state control line (TRI). When the tri-state control is active (logic high), O2 is forced logic low and O1 is forced logic high. The tri-state control is set inactive (logic low) during data transmission, O1 corresponding to input I, and O2 corresponding to input I inverted.

The outputs (O1, O2) of the buffer cells activate each one of the driver cells (DRV). Since the buffer cells (BUF) are driven by subsequent stages from the delay cells (DLY), each subsequent buffer cell activates a corresponding driver cell (DRV) such that the total differential output does not turn on instantaneously.

Figure 11:
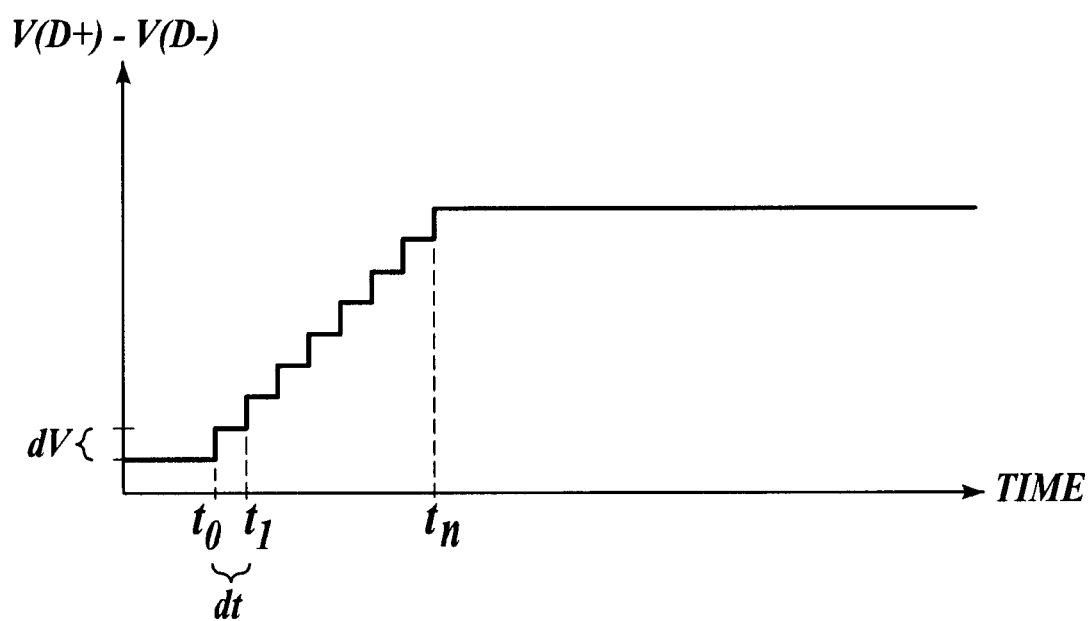
FIG. 11 shows a graph of an output waveform for an output driver.

By delaying the turning on and off of the driver cells, a ramping output signal results as shown in FIG. 11. The delay cells (DLY) are all identical cells, and thus result in a uniform time step (dt) between activating subsequent driver cells (DRV). The time step (dt) is determined by the temperature compensated current reference, which controls the current sources in each delay cell. Each driver cell has a maximum drive capability determined by the current capacity of the cell. When the current from one output driver is driven into a load, the resulting contribution to the differential output voltage is dV. Each delay cell drives a corresponding output driver cell (DRV) such that the differential output voltage (V(D+)−V(D−)) will increase by an amount proportional to the drive capability of each driver cell (dV). Since the current reference is adjustable by an external source, the time step may be adjusted and thus the rise and fall time may be adjusted. The design is scalable to any desired output signal by increasing the number (n) of output stages. Although the output waveform in FIG. 11 shows a ramping waveform, parasitic capacitance and other characteristics of the circuits will smooth out the output waveform.

Figure 12:
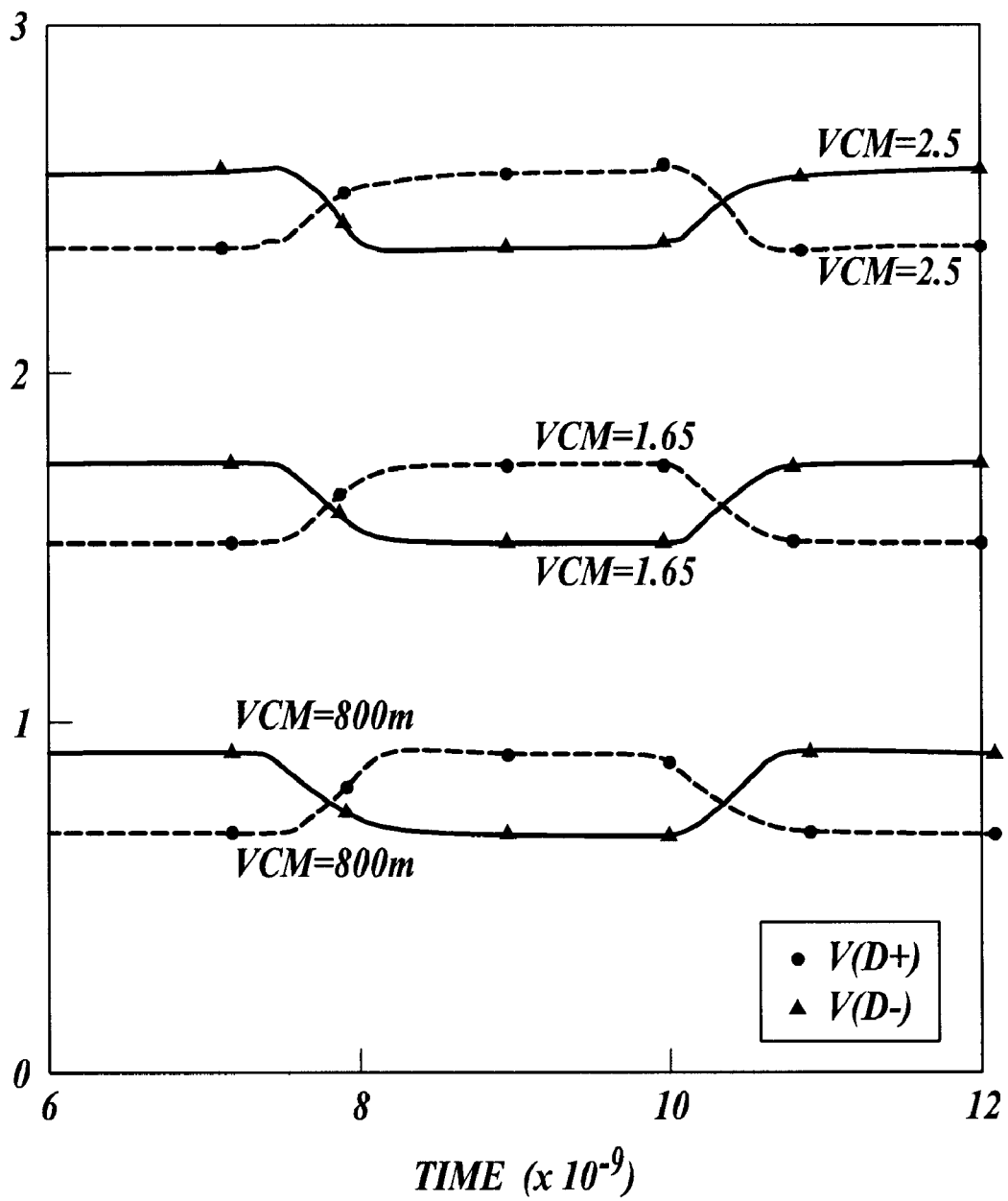
FIG. 12 illustrates three graphs of differential output waveforms for an output driver.
Figure 13:
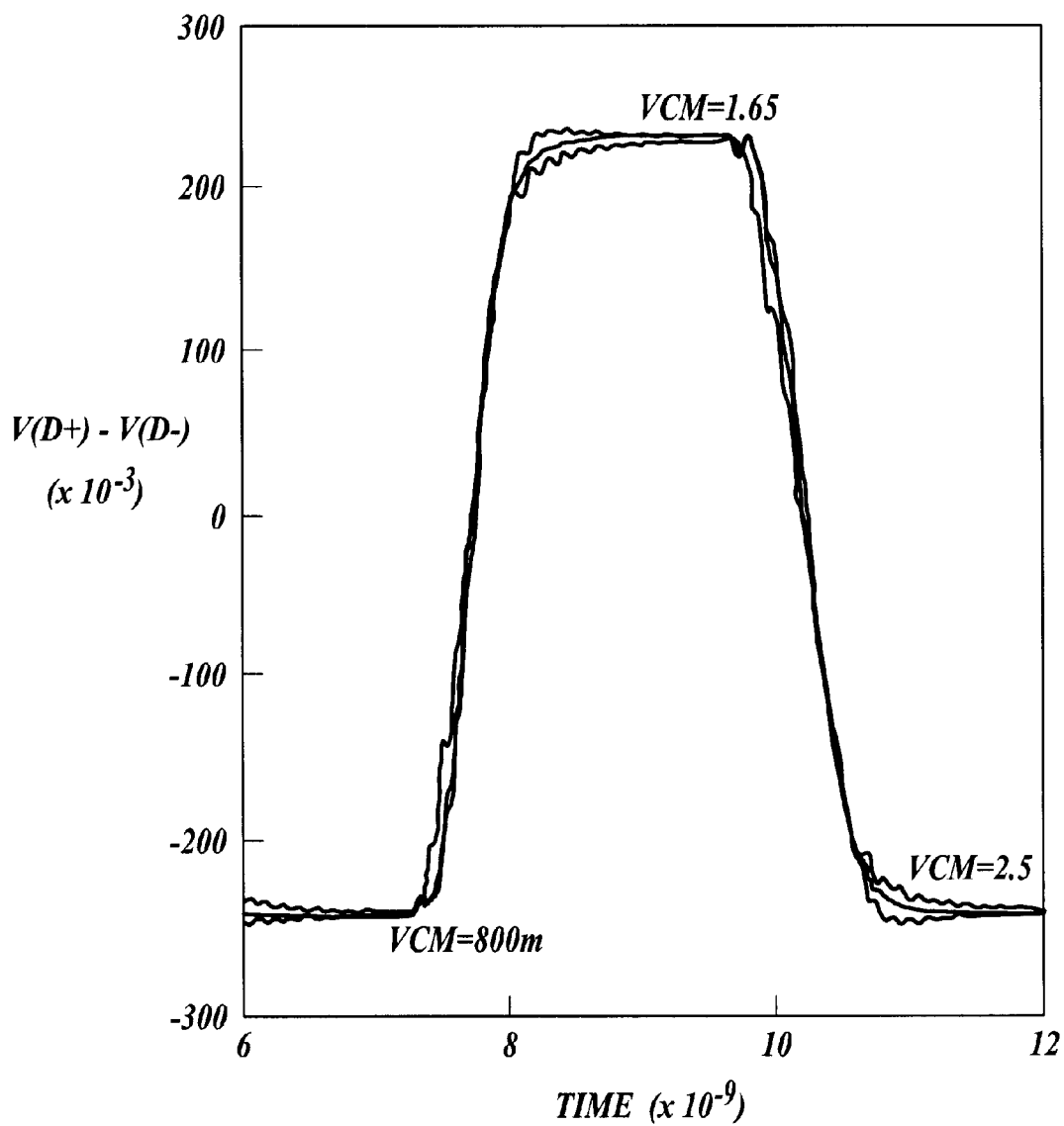
FIG. 13 shows a graph of three superimposed differential output waveforms for an output driver in accordance with the invention.

FIG. 12 shows differential outputs for the present invention over three different common mode voltages (VCM= 0.8v, 1.65v and 2.5v). FIG. 13 shows substantially the same differential outputs shown in FIG. 12, superimposed over one another. Also, the rise and fall times of the differential output signals remain relatively constant over varied common mode voltages.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for generating a differential output signal from an input data signal, comprising:
   (a) a control logic circuit that produces control signals related to the input data signal; and
   (b) a driver circuit that produces the differential output signal in response to the control signals, the driver circuit includes a plurality of driver cells, each of the plurality of driver cells generate a driver output signal in response to associated control signals, the driver output signals being arranged such that each of the plurality of driver cells provides a portion of the differential output signal.

2. An apparatus as in claim 1 wherein a change in the input data signal results in a change in the control signals for one of the plurality of driver cells at a time different from the other of the plurality of driver cells such that the rise time of the differential output signal is proportional to the time difference.

3. An apparatus as in claim 1 wherein a change in the input data signal results in a change in the control signals for one of the plurality of driver cells at a time different from the other of the plurality of driver cells such that the fall time of the differential output signal is proportional to the time difference.

4. An apparatus as in claim 1 wherein the control logic circuit includes a plurality of delay circuits, each of the plurality of delay circuits including a delay cell that is current limited by a current limit amount, a delay time associated with a change in an input of the delay cell and an associated change in an output of the delay cell, the delay time is associated with the current limit amount.

5. An apparatus as in claim 1 wherein the control logic circuit includes a delay circuit with an associated delay time from an input and an associated output of the delay circuit, the delay time is controlled by a current reference that is compensated to reduce variations in the delay time.

6. An apparatus as in claim 5 wherein the current reference includes:
   (a) a MOS transistor that conducts a current that is related to a trans-conductance of the MOS transistor;
   (b) a difference circuit that provides another current that is associated with a difference between a temperature compensated current and the current that is related to the MOS transistor's trans-conductance; and
   (c) another MOS transistor that conducts a bias current that is related to a sum of another temperature compensated current and the other current such that the bias current is inversely proportional to the trans-conductance of the MOS transistor and variations in the delay time due to changes in trans-conductance are reduced.

7. An apparatus as in claim 5 wherein the current reference includes:
   (a) a resistor that is coupled to a temperature compensated current to produce a gate voltage that is independent of temperature;
   (b) a MOS transistor that conducts a current that is associated with the gate voltage;
   (c) a difference circuit that provides another current that is associated with a difference between another temperature compensated current and the current; and
   (d) another MOS transistor that is arranged to conduct a bias current that corresponds to a sum of the other temperature compensated current and the other current, wherein the bias current is independent of temperature and variations in the delay time due to changes in temperature are reduced.

8. An apparatus as in claim 1, further including a current source that provides a controlled current that is coupled to the driver circuit such that each driver output signal is associated with a portion of the controlled current, and the sum of the portions from each output signal are associated with the controlled current.

9. An apparatus as in claim 1 wherein a current source provides power to the plurality of driver cells, the consumption of current by the plurality of driver cells is reduced when disabled.

10. An apparatus as in claim 9, further including:
    (a) a standby circuit that loads the current source when active the standby circuit is activated prior to enabling each of the plurality of driver cells that are disabled and is deactivated after the driver cells are enabled; and
    (b) a load that is provided by the standby circuit to the current source comparable to the load on the current source when each of the disabled driver cells were enabled, such that a glitch in the differential output signal is reduced when disabled driver cells are enabled.

11. An apparatus as in claim 1 wherein each driver cell includes:
    (a) a first, second, third and fourth switching element, each switching element conducts when activated by a respective control signal;
    (b) a first power connection that is coupled to the first and second switching elements; and
    (c) a second power connection that is coupled to the third and fourth switching elements wherein the second and third switching elements are arranged such that when activated the differential output signal is a polarity and the first and fourth switching elements are arranged such that when activated the differential output signal is another polarity.

12. An apparatus as in claim 1 wherein each driver cell further includes an anti-glitch circuit that reduces glitches in the differential output signal.

13. An apparatus as in claim 11 wherein each of the plurality of driver cells further includes an anti-glitch circuit that includes a first, second, third and fourth capacitor coupled to a switching element.

14. An apparatus as in claim 1 wherein a group of the plurality of driver cells are commonly controlled by control signals.

15. An apparatus as in claim 1 wherein control signals are associated with a separate group of the plurality of driver cells, wherein the control signals commonly control the associated separate group of the plurality of driver cells such that the portion of the differential output signal provided by the separate group of the plurality of driver cells is different from the portion provided by another of the plurality of driver cells.

16. An apparatus as in claim 1 wherein the portion of the differential output signal provided by one of the plurality of driver cells is different from the portion of the differential output signal provided by another of the plurality of driver cells.

17. An apparatus for generating a differential output signal from an input data signal, comprising:
   (a) means for producing a time delay;
   (b) means for producing a differential output signal associated with the input data signal; and
   (c) means for controlling an edge rate of the differential output signal such that an edge rate in the differential output signal is proportional to the time delay.

18. An apparatus as in claim 17 wherein the means for controlling the edge rate includes:
   (a) means for producing a first control signal from the input data signal;
   (b) means for producing a second control signal, the second control signal being the same as the first control signal skewed in time by the time delay; and
   (c) means for producing the differential output signal in response to the first and second control signals such that the time delay is associated with an edge rate in the differential output signal.

19. An apparatus as in claim 17 wherein the means for producing a time delay includes means for generating a current level that is inversely proportional to the time delay.

20. An apparatus as in claim 17 wherein the means for generating a differential output signal includes means for generating a plurality of equal outputs staggered over equal time intervals, each of the plurality of outputs is associated with an equal portion of the differential output signal, and the resulting differential output signal having an edge rate associated with a change in the resulting differential output signal over the equal time intervals.

21. An apparatus as in claim 17, further comprising means for maintaining a constant edge rate in the differential output signal for varying common mode voltages in the output signal.

22. A method for generating a differential output signal from an input data signal, comprising:
   (a) generating a control signal in response to a change in the input data at an initial time;
   (b) generating another control signal in response a change in the control signal at a subsequent time;
   (c) producing an output signal in response to the control signal;
   (d) producing another output signal in response to another control signal; and
   (e) summing together the output signal and the other output signal to produce the differential output signal, the edge rate in the differential output corresponding to the difference between the initial time and the subsequent time.

23. A method as in claim 22, further comprising generating a time delay based upon at least one semiconductor processing parameter, the difference between the initial time and the subsequent time is proportional to the time delay.

24. An apparatus for generating a differential output signal from an input signal comprising a driver circuit and an edge-rate control logic circuit, wherein the edge-rate control logic circuit comprises a plurality of delay cells, wherein each of the plurality of delay cells produce a control signal that is related to the input signal, the driver circuit comprises a plurality of driver cells, each of the plurality of driver cells is selectively activated or deactivated by an associated control signal, and each of the plurality of driver cells provides an output signal in response its associated control signal, wherein the driver cells are arranged so that the output signal of each driver cell provides a portion of the differential output signal and each driver cell is selectively turned on or turned off by its associated control signal such that the differential output signal has a controlled edge rate.

25. An apparatus as in claim 24 wherein the input signal has an edge, a first of the plurality of delay cells provides a first control signal that has a first edge that occurs at a time later than the edge in the input signal, and a second of a plurality of delay cells provides a second control signal that has a second edge that occurs at a time later than the edge in the first control signal, such that the control signals selectively activate and deactivate the plurality of drivers at different times such that the differential output signal has a controlled edge rate.

26. An apparatus as in claim 24 wherein a first of a plurality of delay cells provides a first control signal in response to the input signal and a second of a plurality of driver delay cells provides a second control signal in response to the first control signal.

27. An apparatus as in claim 26 wherein the first control signal has a first delay time relative to the input signal, the second control signal has a second delay time relative to the first control signal, and the first delay time is equal to the second delay time.

28. An apparatus as in claim 24, the edge-rate control logic circuit further comprising at least one dummy delay cell, wherein each dummy delay cell provides a load for one of the plurality of delay cells.

* * * * *